(12) United States Patent
Matsushita et al.

(10) Patent No.: US 8,292,188 B2
(45) Date of Patent: Oct. 23, 2012

(54) ELECTRONIC CIRCUIT AND IC TAG

(75) Inventors: Taiga Matsushita, Itabashi-ku (JP);
Katsumi Katakura, Itabashi-ku (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/003,266

(22) PCT Filed: Jun. 29, 2009

(86) PCT No.: PCT/JP2009/062242
§ 371 (c)(1),
(2), (4) Date: Jan. 7, 2011

(87) PCT Pub. No.: WO2010/004943
PCT Pub. Date: Jan. 14, 2010

(65) Prior Publication Data
US 2011/0121085 A1    May 26, 2011

(30) Foreign Application Priority Data
Jul. 9, 2008  (JP) ................................. 2008-179316

(51) Int. Cl.
*G06K 19/06* (2006.01)
(52) U.S. Cl. ........................................ 235/492; 235/451
(58) Field of Classification Search .................. 235/375, 235/451, 492, 487; 340/10.1, 10.5, 572.1, 340/572.2, 572.7
See application file for complete search history.

(56) References Cited

U.S. PATENT DOCUMENTS

| | | | | |
|---|---|---|---|---|
| 5,705,852 A | * | 1/1998 | Orihara et al. | 257/679 |
| 6,452,806 B2 | * | 9/2002 | Ikeda et al. | 361/737 |
| 6,841,871 B2 | * | 1/2005 | Usami | 257/724 |
| 2006/0201703 A1 | * | 9/2006 | Nakata et al. | 174/260 |
| 2007/0159339 A1 | * | 7/2007 | Matsuura et al. | 340/572.8 |

FOREIGN PATENT DOCUMENTS
JP       08-130361 A       5/1996
* cited by examiner

*Primary Examiner* — Tuyen K Vo
(74) *Attorney, Agent, or Firm* — Sughrue Mion, PLLC

(57) ABSTRACT

The present invention provides an electronic circuit which comprises a circuit line and a terminal portion connected to the circuit line, wherein the terminal portion has a folding endurance structure at a junction where the terminal portion is connected to the circuit line and the folding endurance structure of the terminal portion has a plane width gradually-increasing portion, in which the width of the terminal portion in plane view increases continuously or intermittently as the folding endurance structure of the terminal portion becomes away from the junction where the terminal portion is connected to the circuit line. The electronic circuit and an IC tag incorporating the electronic circuit of the present invention are excellent in folding endurance property, and can have an electronic circuit which is hard to break even if the electronic circuit is folded.

12 Claims, 5 Drawing Sheets

ELECTRONIC CIRCUIT AND IC TAG

FIELD OF THE INVENTION

The present invention relates to a non-contact IC tag which can be used for personal certification, goods management, physical distribution and the like, and a structure of an electronic circuit which can be incorporated in the IC tag.

BACKGROUND PRIOR ART

Recently, a non-contact IC tag has been utilized to perform the personal certification, and article managements have been conducted to manage articles such as goods, storage articles and loadings by attaching a non-contact IC tag to articles such as goods, storage articles or loadings for management. For example, the article management has been conducted by attaching an IC tag which has recorded information such as production condition, stock state, cost information and usage condition to the articles and optionally further confirming the recorded information by an interrogator or the like.

An electronic circuit incorporated in the non-contact IC tag or the like comprises a circuit line which forms a coil antenna and a terminal portion composed of a plane flat surface which connects an IC chip and a jumper line. The flat surface of the terminal portion is generally a larger area than that of the circuit line to improve the connection reliability in view of the position movement of the connection to the IC chip and the jumper line, when the plane flat surface of the terminal portion is connected to the IC chip and the jumper line.

However, if there is a large difference between the line width of the connected circuit line and the size of the plane flat surface of the terminal portion (for example, see Patent reference 1), there is a case that the circuit line breaks because the stress concentration is caused at a position near the junction where the terminal portion is connected to the circuit line, when the electronic circuit is folded.

For example, as indicated in FIG. 2, if the circuit line 1 and the terminal portion 3 are connected at the junction 5, the outline of the side edge of the terminal portion 3 is a straight line, and the angle θ between the side edge of the terminal portion 3 and the circuit line 1 is large, there is a case that the circuit line is folded and the circuit line breaks because the stress concentration is caused at a position near the junction 5 where the terminal portion is connected to the circuit line when the electronic circuit is folded along the short side direction of the circuit line 1.

If the circuit line of the electronic circuit is broken, the function of the IC tag is lost, and the management can not be performed by confirming the recorded information.
Patent reference 1; JP2004-227273 A1

DISCLOSURE OF THE INVENTION

Problem to be Solved by the Invention

An object of the present invention is to provide an electronic circuit which is excellent in folding endurance property, and is hard to break even if the electronic circuit is folded, and an IC tag incorporating the electronic circuit.
Means for solving problem As a result of efforts by the present inventors to solve the above-described problems, it was found that the solution of the above described problems are achieved by forming a folding endurance structure at a junction (or a node) where the terminal portion is connected to the circuit line in an electronic circuit which comprises a circuit line and a terminal portion connected to the circuit line. And thus the present invention is completed.

That is to say, the present invention provides an electronic circuit which comprises a circuit line and a terminal portion connected to the circuit line, wherein the terminal portion has a folding endurance structure at a junction (or a node) where the terminal portion is connected to the circuit line.

The present invention also provides the electronic circuit as described above, wherein the folding endurance structure of the terminal portion has a plane width gradually-increasing portion, in which the width of the terminal portion in plane view increases continuously or intermittently as the folding endurance structure of the terminal portion becomes away from the junction where the terminal portion is connected to the circuit line.

The present invention also provides the electronic circuit as described above, wherein at least one side edge of the plane width gradually-increasing portion connected to the junction of the terminal portion is a curved line figure.

The present invention also provides the electronic circuit as described above, wherein the terminal portion is selected from an IC chip mounting terminal portion, a jumper terminal portion or a through-hole terminal portion.

The present invention further provides an IC inlet which comprises an IC chip connected to the electronic circuit as described above.

The present invention furthermore provides an IC tag which comprises a protecting layer laminated to cover the IC chip of the IC inlet as described above.

Effect of the Invention

The electronic circuit and an IC tag incorporating the electronic circuit of the present invention are excellent in folding endurance property, and can be or have an electronic circuit which is hard to break even if the electronic circuit is folded.

In drawings, 1 means a circuit line, 2 means a terminal portion, 3 means a terminal portion, 4 means a terminal portion, 5 means a junction, 6 means an IC chip, 7 means an insulating layer, 8 means a jumper line, 9 means a side edge, 10 means a side edge, 11 means a plane width gradually-increasing portion, 12 means a through-hole terminal portion, 13 means a circuit line, 14 means a pressure-sensitive adhesive layer, 15 means a protecting sheet, 16 means an IC tag, 17 means a polyethylene terephthalate film, 18 means a cylindrical roll, 19 means a dead weight, and 21 means a substrate sheet.

MODE FOR CARRYING OUT THE INVENTION

Figure 1:
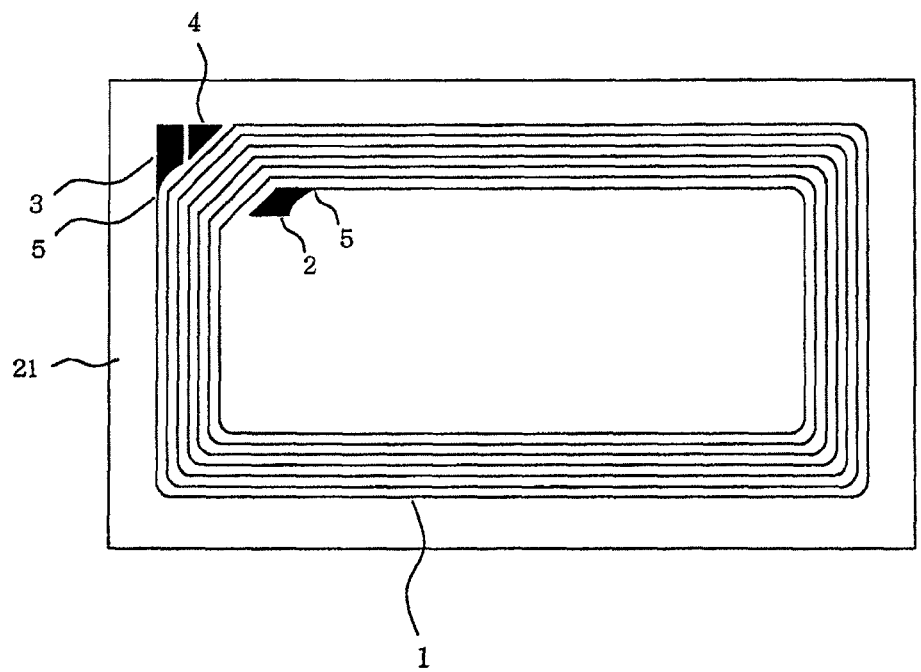
FIG. 1 shows a plane view of an electronic circuit of one embodiment of the present invention.

The electronic circuit of the present invention is explained based on the drawings. FIG. 1 shows a plane view of an outline in an electronic circuit of one embodiment of the present invention.

FIG. 1 shows one embodiment of an electronic circuit for producing an (non-contact) IC tag. The electronic circuit comprises a circuit line 1, a terminal portion 2 and a terminal portion 3 connected to the circuit line 1, and a terminal portion 4 spaced to the terminal portion 3.

The terminal portion 2 is connected to the end of the most inside line of the circuit line 1, and is a jumper terminal portion for connecting one end of the jumper line. The terminal portion 3 is connected to the end of the most outside line of the circuit line 1, and is an IC chip-mounting terminal portion for mounting one end of the IC chip. The terminal portion 4 forms the IC chip-mounting terminal portion together with the terminal portion 3, and is a terminal portion which does not connect to the circuit line.

The circuit line and the terminal portion are composed of a conductive material. The conductive material includes, for example, a simple substance of metal such as a metallic foil, a vapor deposition film and a thin film produced by sputtering. As the simple substance of metal, gold, silver, nickel, cupper, aluminium and the like can be used. As the other conductive material, conductive pastes or conductive inks in which the particle of metal such as gold, silver, nickel and cupper is dispersed in a binder or a solvent, can be used.

The average particle size of the metal particle is preferably in the range of 0.001 to 15 µm, and more preferably in the range of 0.001 to 10 µm. The binder includes, for example, a polyester resin, a polyurethane resin, an epoxy resin and a phenol resin.

The solvent includes, for example, alcohols such as hexanol, heptanol, octanol and cyclohexanol; long-chain alkanes such as hexane, heptane, octane and trimethylpentane; cyclic alkanes such as cyclohexane and cycloheptane; aromatic hydrocarbons such as benzene, toluene, xylene and trimethylbenzene; acetone and water. The solvents can be used singly, or as a mixture solvent of 2 or more selected members.

The figure of the electronic circuit includes, for example, a figure as indicated in FIG. 1. In FIG. 1, the electronic circuit functioned as an antenna is formed by arranging the circuit line 1 of a line of conductive material in septet spiral ring having specific space between each line in the direction from the outside circumference of a rectangle substrate sheet 21 to the inside of the rectangle substrate sheet 21. The electronic circuit may be arranged in septet spiral ring as indicated in FIG. 1, or may be arranged in singlet spiral ring to sextet spiral ring, or eight or more multiplex spiral ring.

Further, the figure of the electronic circuit does not need to be in tetragon spiral ring as indicated in FIG. 1, and, for example, may be each of a spiral ring having polygon other than tetragon, a circular spiral ring or an elliptical spiral ring. Furthermore, the figure of the electronic circuit does not need to be a coiled figure in ring, and may be a figure in which a breaking of line is formed in the intermediate portion of a straight line or a curved line and a pair of the IC chip mounting terminal portions are provided in the breaking of line. Thus, the figure of the electronic circuit can be selected from all figures suitable for resonance frequency of electric wave.

Figure 6:
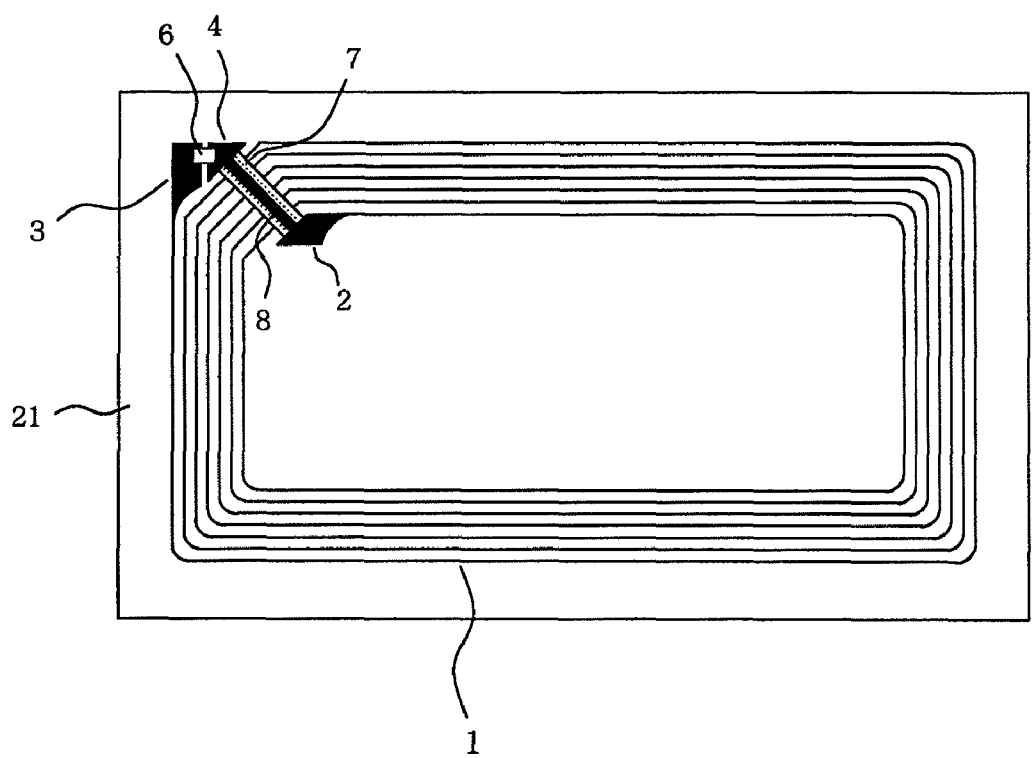
FIG. 6 shows a plane view of an IC inlet in which a jumper line is wired and an IC chip is mounted to an electronic circuit of one embodiment of the present invention.

In FIG. 6, the IC chip 6 is set outside the spiral ring of the electronic circuit, but, the IC chip 6 may be set inside the spiral ring of the electronic circuit, in the midway of the electronic circuit, or in the upper position of the electronic circuit. When the IC chip 6 is set inside the spiral ring of the electronic circuit, the terminal portion 2 can be set outside the electronic circuit and the terminal portion 3 and the terminal portion 4 can be set inside the electronic circuit.

The electronic circuit of the present invention is characterized by having a folding endurance structure at a junction where the terminal portion is connected to the circuit line.

The folding endurance structure of the terminal portion includes a folding endurance structure having a plane width gradually-increasing portion, in which the width of the terminal portion in plane view increases continuously or intermittently as the folding endurance structure of the terminal portion becomes away from the junction where the terminal portion is connected to the circuit line.

The plane width gradually-increasing portion can exist in all portions of the terminal portion or in a part of the terminal portion, but, preferably exists from just back position of the junction.

The plane width of the terminal portion means a length in the width direction of the plane terminal portion. Concretely, the plane width of the terminal portion is a length of the plane terminal portion in the right angle direction to the tangent line of the circuit line.

Also, the preferable plane width gradually-increasing portion is a plane width gradually-increasing portion in which the increasing rate of the width of the terminal portion in plane view increases continuously or intermittently as the folding endurance structure of the terminal portion becomes away from the junction where the terminal portion is connected to the circuit line. Hereat, the increasing rate of the width of the terminal portion in plane view can be represented as an increased length of the plane width per unit length.

The preferable plane width gradually-increasing portion includes a plane width gradually-increasing portion in which at least one side edge of the plane width gradually-increasing portion connected to the junction of the terminal portion is a concave curved line figure.

Figure 3:
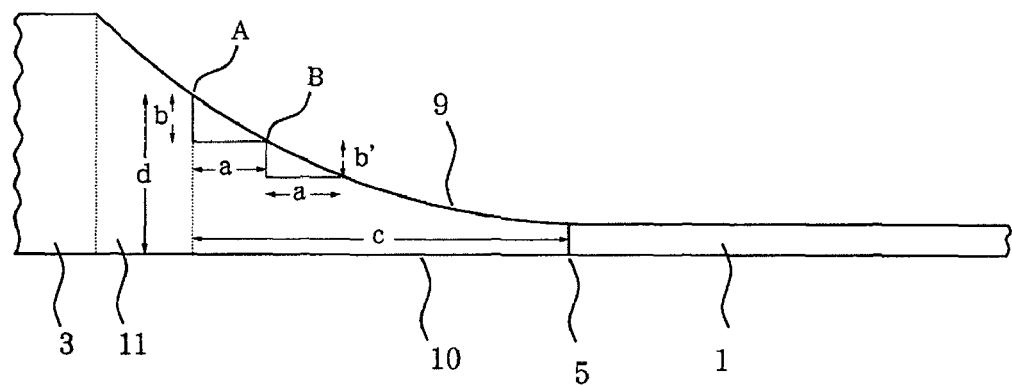
FIG. 3 shows a plane view of a connection condition of a circuit line and a terminal portion in an electronic circuit of one embodiment of the present invention.

For example, as indicated in FIG. 3, the terminal portion 3 connected to the circuit line 1 at the junction 5 has a plane width gradually-increasing portion 11 connected to the junction 5. One side edge 10 of the width direction of the plane width gradually-increasing portion 11 is on the tangent line of the circuit line 1 at the junction 5 and is a straight line figure. Another side edge 9 of the width direction of the plane width gradually-increasing portion 11 is a concave curved line figure.

As indicated in FIG. 3, in the plane width gradually-increasing portion 11, the width of the terminal portion in plane view increases continuously as the folding endurance structure of the terminal portion becomes away from the junction where the terminal portion is connected to the circuit line. But, the width of The terminal portion in plane view can increase intermittently. Hereat, the word of "intermittently" means a condition where a portion increasing continuously in the plane width and a portion not increasing continuously in the plane width are repeated. For example, the condition includes a condition where a portion increasing continuously in the plane width and a portion having a constant plane width are repeated. In the present invention, the preferable width of the terminal portion in plane view in the plane width gradually-increasing portion increases continuously as the folding endurance structure of the terminal portion becomes away from the junction where the terminal portion is connected to the circuit line.

In FIG. 3, when the plane width of the terminal portion at the point A on the side edge 9 of concave curved line figure is "d" and the unit length of the tangent line of the circuit line is "a", the increased width of the point A from the point B on the concave curved line figure approaching to the junction 5 by the unit length "a" from the point A is "b". In the same manner as described above, the increased width of the point B is "b'". In FIG. 3, the increased width b of the point A is larger than the increased width b' of the point B. But, the increased width b of the point A can be smaller than the increased width b' of the point B. The unit length can be selected from all lengths. For example, the unit length a can be selected properly from the range between 0.01 mm and 10 mm.

In FIG. 3, even if the point A and the point B are set at any positions on the side edge 9, the increasing rate of the plane width of the terminal portion in the plane width gradually-increasing portion 11 increases continuously as the plane width gradually-increasing portion becomes away from the junction 5.

Also, in FIG. 3, only the side edge 9 of the plane width gradually-increasing portion 11 is a concave curved line figure. But, the side edge 10 of the plane width gradually-increasing portion 11 can be also a concave curved line figure, or can be also a straight line or a curved line which is strayed in the inside direction or the outside direction from the tangent line of the circuit line at the junction where the circuit line and the terminal portion are connected.

The increasing rate of the plane width of the terminal portion in the plane width gradually-increasing portion can be represented by the angle included between the tangent line on the concave curved line of the side edge figure of the plane width gradually-increasing portion and the straight line extended from the circuit line.

Figure 4:
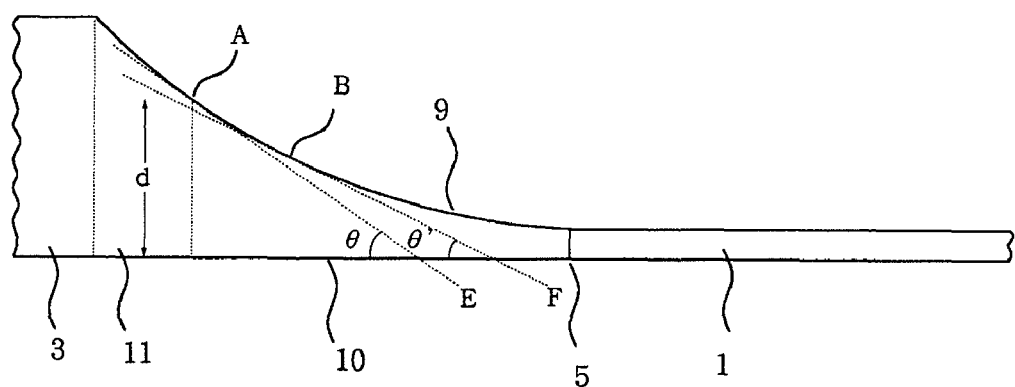
FIG. 4 shows a plane view of a connection condition of a circuit line and a terminal portion in an electronic circuit of one embodiment of the present invention.

For example, as shown in FIG. 4, the angle θ included between the tangent line E of the concave curved line at the point A on the side edge 9 which is a concave curved line figure and the straight line extended from the circuit line, is larger than the angle θ' included between the tangent line F of the concave curved line at the point B which is nearer to the junction 5 than the point A and the straight line extended from the circuit line.

In FIG. 4, even if the point A and the point B are set at any positions on the side edge 9, the increasing rate of the plane width of the terminal portion increases continuously as the terminal portion becomes away from the junction.

When the concave curved line is a circular arc which is a part of a circular, the curvature of the circular arc does not have any limitation particularly, but, it is preferably in the range of 1 mm to 20 mm, more preferably in the range of 1.5 mm to 15 mm, and most preferably in the range of 2 mm to 10 mm in representation as radius R.

The side edge 9 can be a concave curved line figure or a straight line figure in the overall side edge, or can contain a straight line figure in a part of the side edge.

If the side edge 9 is a concave curved line from just back position of the junction 5, the increasing rate of the plane width of the terminal portion increases continuously as the terminal portion becomes away from the junction. But, if the side edge 9 is a straight line in the just back position of the junction 5 and a concave curved line after the straight line, the increasing rate of the plane width of the terminal portion is constant in the straight line portion and increases continuously in the concave curved line portion as the terminal portion becomes away from the junction.

In each case, the angle θ of the tangent line in the just back position of the junction 5 is preferably small, more preferably not more than 35 degree, further more preferably not more than 20 degree, and most preferably not more than 10 degree.

The plane width gradually-increasing portion 11 is preferably formed in the range of not less than 3 mm in the tangent line direction at the junction of the circuit line, and more preferably formed in the range of not less than 5 mm in the tangent line direction at the junction of the circuit line.

The increasing rate of the plane width of the terminal portion in the plane width gradually-increasing portion can increase continuously or intermittently as the terminal portion becomes away from the junction. Hereat, the word of "intermittently" means a condition where a portion increasing continuously in the increasing rate of the plane width and a portion not increasing continuously in the increasing rate of the plane width are repeated. For example, the condition includes a condition where a portion increasing continuously in the increasing rate and a portion having a constant increasing rate are repeated. If the increasing rate of the plane width in the terminal portion increases intermittently as the terminal portion becomes away from the junction, the portion having constant increasing rate from the just back position of the junction can be formed, or the portion increasing continuously the increasing rate from the just back position of the junction can be formed.

Figure 5:
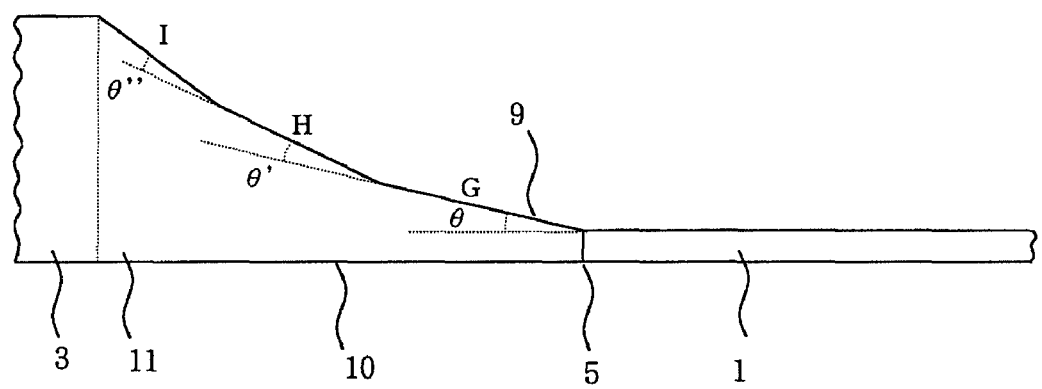
FIG. 5 shows a plane view of a connection condition of a circuit line and a terminal portion in an electronic circuit of other one embodiment of the present invention.

Preferable example of the case that the increasing rate of the plane width of the terminal portion in the plane width gradually-increasing portion increases intermittently as the terminal portion becomes away from the junction includes an embodiment as indicated in FIG. 5.

In FIG. 5, the terminal portion 3 connected to the circuit line 1 at the junction 5 has the plane width gradually-increasing portion 11 connected to the junction 5. One side edge 10 in the width direction of the plane width gradually-increasing portion 11 is on a straight line extended from the circuit line 1 at the junction 5, and is a straight line figure. Another side edge 9 in the width direction of the plane width gradually-increasing portion 11 is a figure in which plural straight lines having different inclination are connected in order from the straight line having a small inclination to the straight line having a large inclination, and, that is, a polygonal line figure.

In the straight portion of the side edge 9, the increasing rate of the plane width is constant regardless of the length distant from the junction, but the increasing rate of the plane width increases across the connected point of straight lines having different inclinations. By setting plural connected points of straight lines having different inclinations in the side edge 9, the increasing rate of the plane width of the terminal portion increases intermittently as the terminal portion becomes away from the junction.

In FIG. 5, the angle θ included between the straight line G of the side edge 9 of the plane width gradually-increasing portion 11 connected to the junction 5 and the straight line extended from the circuit line is preferably small, more preferably not more than 35 degree, further more preferably not more than 20 degree, and most preferably not more than 10 degree.

Also, the angle included by the straight lines at the connected point of straight lines having different inclinations can be represented, for example, as the angle θ' included by the straight line G and the straight line H, the angle θ" included by the straight line H and the straight line I, or the like. The angle is also preferably small, more preferably not more than 35 degree, further more preferably not more than 20 degree, and most preferably not more than 10 degree. The lower limit value of the angle θ', the angle θ" or the like does not have any limitation particularly, so long as the lower limit value is more than 0 degree, but the lower limit value is preferably not less than 1 degree.

The length of each straight line can be selected properly, but is preferably in the range of 0.5 to 5 mm, and more preferably in the range of 1 to 3 mm.

In FIG. 5, the side edge 9 is a polygonal line, but the figure of the side edge 9 at the near position to the connected point of straight lines having different inclinations can be a circularly curved line.

The thicknesses of the circuit line 1, the terminal portion 2, the terminal portion 3 and the terminal portion 4 are not limited particularly, but can be the same or different. When the circuit line 1, the terminal portion 2, the terminal portion 3 and the terminal portion 4 are metallic foils, the thicknesses are preferably in the range of 5 to 100 μm. When they are the vapor deposition film or the metal film prepared by spattering, the thicknesses are preferably in the range of 0.01 to 30 μm. When they are the conductive paste or the conductive ink, the thicknesses are preferably in the range of 1 to 30 μm.

When the circuit line is a metallic foil and the thickness of the metallic foil is thin, the present invention is more effective. For example, it is most effective when the thickness of the metallic foil is not more than 50 μm.

The width of the circuit line 1 does not have any limitation particularly, but is preferably in the range of 10 to 1000 μm, and more preferably in the range of 50 to 600 μm.

The electronic circuit and the terminal portion are generally formed on the surface of the substrate sheet.

The substrate sheet 21 is preferably papers such as a wood free paper and a coated paper, a nonwoven fabric and a sheet composed of a synthetic resin, and more preferably a sheet composed of a thermoplastic resin.

As the sheet composed of the thermoplastic resin, for example, the sheets composed of one or more of various synthetic resins, such as polyolefin resins like polyethylene resins of high density polyethylene, middle density polyethylene, low density polyethylene and the like, polypropylene resins, polymethyl-1-pentene/ethylene/cyclic olefin copolymer, and ethylene-vinyl acetate copolymer; polyester resins like polyethylene terephthalate, polyethylene naphthalate and polybutylene terephthalate; polyvinyl chloride resins; polyvinylalcohol resins; polyvinylacetal resins; polystyrene resins; polycarbonate resins; polyamide resins; polyimide resins; fluororesins; acrylonitril/butadiene/styrene copolymer; copolymers containing two or more polymerization units thereof; polymer blends containing two or more resins thereof; polymer alloys containing one or more resins thereof can be used. In particular, the sheets composed of polyester resins are preferably used.

The substrate sheet 21 may be drawn uniaxially or biaxially. The substrate sheet 21 may be composed of single layer or two or more layers of different layers or same layers. Also, the substrate sheet 21 has preferably water resistance. If the substrate sheet has water resistance, damage such as breaking of the substrate 1 is not caused when the substrate sheet is wet with water. Also, the substrate sheet 21 is preferably a substrate sheet having a hiding property in order to have difficulty to observe the electronic circuit by visual. When the substrate sheet 21 does not have a hiding property, the surface of the substrate sheet 21 is preferably laminated with a sheet having a hiding property.

Thickness of the substrate sheet 21 does not have any limitation. However, the thickness of the substrate sheet 21 is generally in the range of 5 to 500 μm, preferably in the range of 10 to 200 μm and more preferably in the range of 25 to 125 μm.

In order to increase the adhesive force between the substrate sheet 21 and the adhesive layer laminated on the substrate sheet 21, the surface treatment can be conducted on the surface of the substrate sheet 21. The surface treatment includes, for example, a corona discharge treatment, a chemical treatment and a resin coating.

The method for forming the circuit line 1, the terminal portion 2, the terminal portion 3 and the terminal portion 4 on the substrate sheet 21 includes, for example, a method for forming the circuit line 1, the terminal portion 2, the terminal portion 3 and the terminal portion 4 by laminating a metal foil to the substrate sheet 21 with an adhesive, printing a resist pattern in the figure of the circuit line 1, the terminal portion 2, the terminal portion 3 and the terminal portion 4 by screen printing or the like, and then removing the metal foil of the portion except for the circuit line 1, the terminal portion 2, the terminal portion 3 and the terminal portion 4 by the etching treatment and washing the resist to form the circuit line 1, the terminal portion 2, the terminal portion 3 and the terminal portion 4. The etching treatment can be conducted by the same treatment as ordinary etching treatments. Also, the forming of the circuit line 1, the terminal portion 2, the terminal portion 3 and the terminal portion 4 on the surface of the substrate sheet 21 can be conducted by adhering the conductive paste or the conductive ink in the figure of the circuit line 1, the terminal portion 2, the terminal portion 3 and the terminal portion 4 by the means of printing such as glaive printing method, flexographic pressing method, screen printing method and inkjet printing method, applying or the like.

Figure 7:
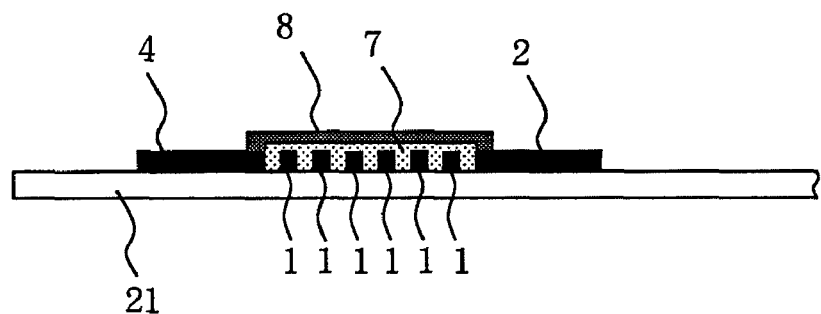
FIG. 7 shows a sectional view of a state that a jumper line is wired to an electronic circuit of one embodiment of the present invention.

The terminal portion 2 and the terminal portion 4 are connected with a jumper line 8. For example, as indicated in FIG. 6 and FIG. 7, the terminal portion 2 and the terminal portion 4 are connected with a jumper line 8 by forming the insulating layer 7 on the upper surface portion of the spiral ring circuit line 1 between the terminal portion 2 and the terminal portion 4, and then forming the jumper line 8 on the insulating layer 7.

The method for forming the jumper line 8 includes a method for connecting the terminal portion 2 and the terminal portion 4 by printing an insulating ink in band crossing on the upper surface portion of the spiral ring circuit line 1 between the terminal portion 2 and the terminal portion 4 by screen printing or the like and drying to form an insulating layer 7, and then printing a conductive paste in line on the printed insulating layer 7 by screen printing or the like and drying to form the jumper line 8. The conductive paste includes the conductive pastes illustrated as the conductive material described before. The insulating ink includes photo-curable ink such as ultraviolet curable ink comprising acrylic resin or urethane resin as main component.

The terminal portion 3 and the terminal portion 4 are connected by the IC chip 6.

The method for connecting the IC chip 6 includes a method for connecting the IC chip 6 on the surfaces of the terminal portion 3 and the terminal portion 4 through the anisotropic conductive film or the anisotropic conductive paste by a flip-chip bonding method. The flip-chip bonding method is a method for conducting easily between the terminal portion 3, the terminal portion 4 and the IC chip 6 by forming a wire bump on an electrode portion of the IC chip 6, and pressing the surface of the wire bump formed on the IC chip 6 on the anisotropic conductive film or the anisotropic conductive paste covered on the surfaces of the terminal portion 3 and the terminal portion 4 so that the wire bump inserts in the anisotropic conductive film or the anisotropic conductive paste. By connecting the IC chip 6 to the terminal portion 3 and the terminal portion 4 in the manner described above, the electronic circuit connected with the IC chip 6, that is, the IC inlet can be produced.

Figure 8:
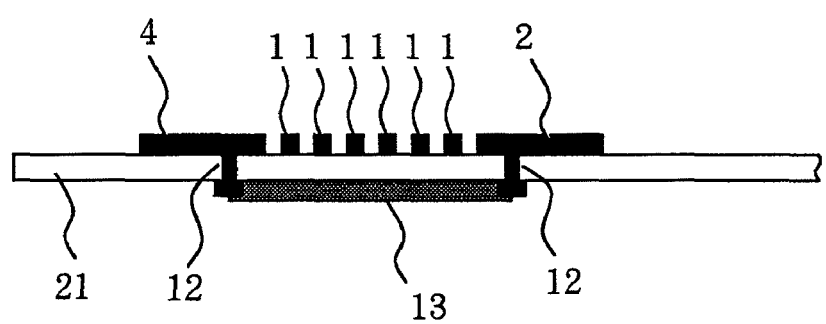
FIG. 8 shows a sectional view of a state that a through-hole is provided to an electronic circuit of one embodiment of the present invention.

As indicated in FIG. 8, the circuit line 13 can be connected between the through-hole terminal portions 12 by introducing the terminal portion 2 and the terminal portion 4 to the back surface of the substrate sheet 21 with the through-hole, instead of connecting the terminal portion 2 and the terminal portion 4 by the jumper line on the ring circuit line.

The IC tag of the present invention can be produced by laminating the protecting layer on the surface of the IC inlet on which the circuit line, the terminal portion, the IC chip and the like are provided. The protecting layer includes a pressure-sensitive adhesive layer and a protecting sheet for laminating through the pressure-sensitive adhesive layer.

The protecting sheet is used for protecting the surface of the IC inlet. The protecting sheet includes the same material as that of the substrate 1 mentioned before, and concretely, for example, the sheets composed of the various resins, such as the sheets composed of polyolefin resins like polyethylene resins of high density polyethylene, middle density polyethylene, low density polyethylene and the like, polypropylene resins, polymethyl-1-pentene/ethylene/cyclic olefin copolymer, and ethylene-vinyl acetate copolymer; polyester resins like polyethylene terephthalate, polyethylene naphthalate, and polybutylene terephthalate; various paper materials such as papers laminated with polyethylene, papers laminated with polypropylene, clay-coated papers, resin-coated papers, glassine papers and wood free papers and the like.

Pressure-sensitive adhesives used in the pressure-sensitive adhesive layer include, for example, natural rubber pressure-sensitive adhesives, synthetic rubber pressure-sensitive adhesives, acrylic resin pressure-sensitive adhesives, polyester resin pressure-sensitive adhesives, polyvinyl ether resin pressure-sensitive adhesives, urethane resin pressure-sensitive adhesives and silicone resin pressure-sensitive adhesives.

Examples of the synthetic rubber pressure-sensitive adhesives include styrene-butadiene rubber, polyisobutylene rubber, isobutylene-isoprene rubber, isoprene rubber, styrene-isoprene block copolymer, styrene-butadiene block copolymer, styrene-ethylene-butylene block copolymer, ethylene-vinyl acetate thermoplastic elastomer and the like. Examples of the acrylic resin pressure-sensitive adhesives include homopolymers of single monomer such as acrylic acid, methyl acrylate, ethyl acrylate, propyl acrylate, butyl acrylate, 2-ethylhexyl acrylate, methyl methacrylate, ethyl methacrylate, butyl methacrylate, and acrylonitrile, or copolymers of 2 or more of monomers thereof. Polyester resin pressure-sensitive adhesives are copolymers of a polyhydric alcohol and a polybasic acid. The polyhydric alcohol includes ethylene glycol, propylene glycol, and butanediol. The polybasic acid includes terephthalic acid, adipic acid, and maleic acid. Examples of the polyvinyl ether resin pressure-sensitive adhesives include polyvinyl ether, and polyvinyl isobutyl ether. Examples of the silicone resin pressure-sensitive adhesives include dimethyl polysiloxane. The pressure-sensitive adhesives can be used singly or in combination of two or more members.

A tackifier, a softener, an antioxidant, a filler, a coloring agent such as a dye and a pigment or the like can be mixed in the pressure-sensitive adhesive layer, according to needs.

The tackifier includes rosin resins, terpene phenol resins, terpene resins, aromatic hydrocarbon modified terpene resins, petroleum resins, coumarone-indene resins, styrene resins, phenol resins and xylene resins. The softener includes process oils, liquid rubbers and plasticizers. The filler includes silica, talc, clay, calcium carbonate and the like.

Thickness of the pressure-sensitive adhesive layer does not have any limitation. However, the thickness is generally in the range of 1 to 200 μm and preferably in the range of 3 to 100 μm.

The pressure-sensitive adhesive layer in the present invention includes also a pressure-sensitive adhesive layer of pressure-sensitive adhesive double coated tape type in which the pressure-sensitive adhesive is laminated on both sides of a middle substrate in sheet. The middle substrate can be selected from the members mentioned before as the substrate 21. As the pressure-sensitive adhesive which is laminated on both sides of the middle substrate, the pressure-sensitive adhesives mentioned before can be used.

Figure 9:
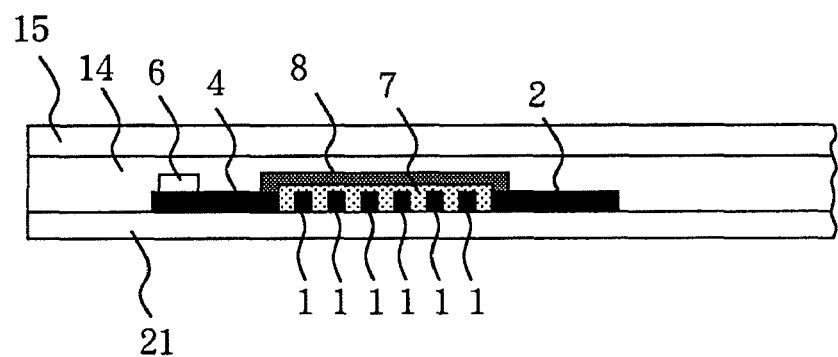
FIG. 9 shows a sectional view of a state that a protecting sheet is laminated to an IC tag of one embodiment of the present invention.

In the IC tag of the present invention, for forming the pressure-sensitive adhesive layer to the surface of the substrate sheet 21 on which the electronic circuit is formed, for example, as indicated in FIG. 9, the pressure-sensitive adhesive layer 14 can be formed by applying the pressure-sensitive adhesive on the surface so as to cover the substrate sheet 21, the circuit line 1, the terminal portions such as the terminal portion 2 and the terminal portion 4, the IC chip 6 and the jumper line 8, or by forming a pressure-sensitive adhesive layer on the surface of the release agent layer of the release liner by applying the pressure-sensitive adhesive and then laminating on the surface so as to cover the substrate sheet 21, the circuit line 1, the terminal portions such as the terminal portion 2 and the terminal portion 4, the IC chip 6 and the jumper line 8.

Methods for applying the pressure-sensitive adhesive do not have any limitation, and various methods can be used by various coaters. The coaters include, for example, air knife coater, blade coater, bar coater, gravure coater, roll coater, curtain coater, die coater, knife coater, screen coater, Mayer bar coater and kiss coater.

In the present invention, the lamination of the protecting sheet 15 is conducted by laminating the protecting sheet 15 on the surface of the pressure-sensitive adhesive layer 14.

In the present invention, another pressure-sensitive adhesive layer can be formed on the surface of the substrate sheet on which the protecting sheet 15 is not laminated. As the pressure-sensitive adhesive layer, the pressure-sensitive adhesive layer mentioned before can be used.

Further, a release sheet can be laminated on the surface of the pressure-sensitive adhesive layer.

EXAMPLES

The present invention will be explained by examples more concretely in the next paragraph. However, the present invention is not restricted at all by these examples.

Example 1

On the copper foil surface of a copper foil laminated sheet (trade name "Nikaflex F-10T50C-1", produced by NIKKAN INDUSTRIES Co., Ltd.) in which the copper foil (having thickness of 35 μm) and a polyethylene terephthalate film (having thickness of 50 μm) are laminated, a resist pattern was printed in the figure of the circuit line 1, the terminal portion 2, the terminal portion 3 and the terminal portion 4 by screen printing method. And then, the copper foil of the useless portion was removed by etching to form the integral wiring pattern as shown in FIG. 1. The line width of the circuit line 1 was 200 μm. The length in the long side direction of the tetragon ring circuit line was 61 mm, and the length of the short side direction of the tetragon ring circuit line was 32 mm.

The terminal portion 2 was connected to the end of the most inside circuit line 1 at the junction 5, and has a plane width gradually-increasing portion from just back position of the junction. The length in the long side direction of the plane width gradually-increasing portion was 2.5 mm, and the maximum plane width of the plane width gradually-increasing portion was 2.5 mm, and one side edge of the plane width gradually-increasing portion was a concave curved line figure (curvature: a figure of the circular arc having 2.5 mm in radius R). The terminal portion 3 was connected to the end of the most outside circuit line 1 at the junction 5, and has a plane width gradually-increasing portion from just back position of the junction. The length in the short side direction of the plane width gradually-increasing portion was 2.4 mm, and the maximum plane width of the plane width gradually-increasing portion was 1.9 mm, and one side edge of the plane width gradually-increasing portion was a concave curved line figure (curvature: a figure of the circular arc having 2.5 mm in radius R).

Subsequently, an insulating resist ink (produced by TOYOBO CO., LTD., trade name "FR-100G-35") was printed between the terminal portion 2 and the terminal portion 4 by screen printing method to cover the spiral ring circuit line and then dried to form an insulating layer 7. Further, a silver paste (produced by TOYOBO CO., LTD., trade name "DW250L-1") was printed between the terminal portion 2 and the terminal portion 4 by screen printing method and then dried to form a jumper line 8. Thus, the jumper line 8 was connected to the terminal portion 2 and the terminal portion 4 to form an electronic circuit.

A RFID-IC chip (produced by NXP CO., trade name of "I-CODE SLI") was mounted on the formed electronic circuit. The mounting was conducted by using a flip chip packaging machine (produced by KYUSHU MATSUSHITA ELECTRIC CO. LTD., trade name "FB30T-M"). As the bonding material, an anisotropic conductive adhesive (produced by KYOCERA Chemical Corporation, trade name "TAP0402E") was used and a thermo compression bonding was conducted under the condition of 220° C., 2.00 N and 7 seconds to form an electronic circuit mounted with the IC chip (IC inlet).

Next, a pressure-sensitive adhesive double coated tape (produced by LINTEC Corporation, trade name "PET25W PAT1 8KX") was laminated and adhered on the surface of the formed electronic circuit mounted with the IC chip on which the electronic circuit was formed, and further, a surface substrate film usable for printing (produced by TOYOBO CO., LTD., trade name "CRISPER K2411") was laminated and adhered as a protecting sheet through an acrylic resin pressure-sensitive adhesive (produced by LINTEC Corporation, trade name "PA-T1", thickness of 20 μm) on the opposite surface to the surface on which the electronic circuit was mounted with the IC chip, to form an IC tag. Thus, 40 pieces of IC tags were produced.

An outline of the IC tag had a length of the long side direction of 65 mm and a length of the short side direction of 35 mm.

The operation of the IC tag was confirmed by conducting a reading and writing test (test machine produced by FEIG ELECTRONIC GmbH, trade name "ID ISC. MR101-USB"). All 40 pieces of the produced IC tags operated normally.

Figure 10:
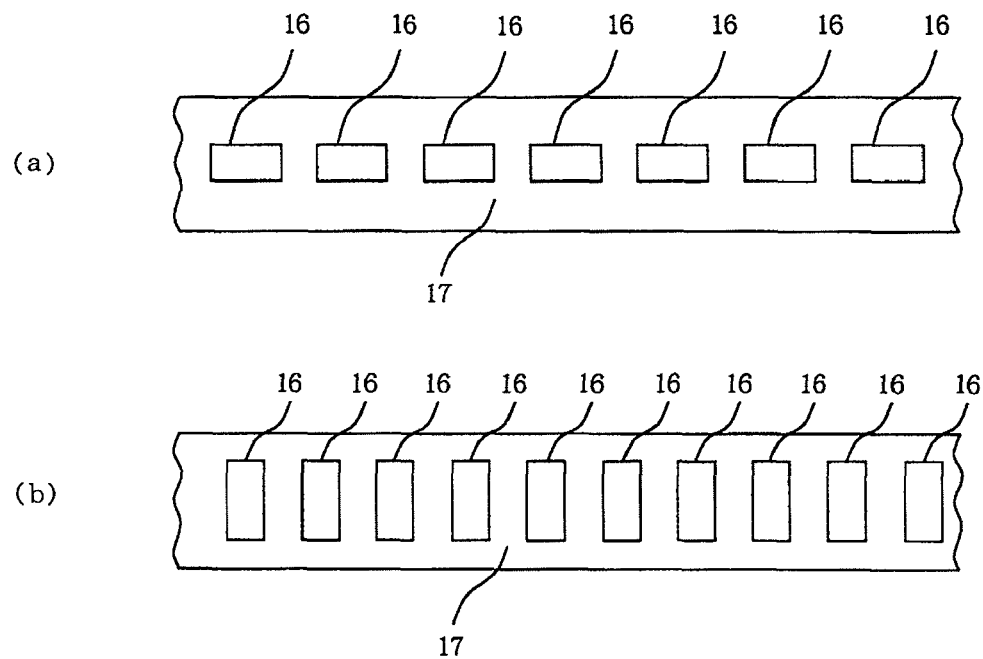
FIG. 10 shows a plane view of a long sheet used for a test of an IC tag of the present invention used for a bending test, wherein (a) shows a plane view of a long sheet used for a test in which IC tags are attached on a polyethylene terephthalate film with adhesive layers in a state that IC tags are lined intermittently in the condition that each IC tag is placed in long side direction of the IC tag, and (b) shows a plane view of a long sheet used for a test in which IC tags are attached on a polyethylene terephthalate film with adhesive layers in a state that IC tags are lined intermittently in the condition that each IC tag is placed in short side direction of the IC tag.
Figure 11:
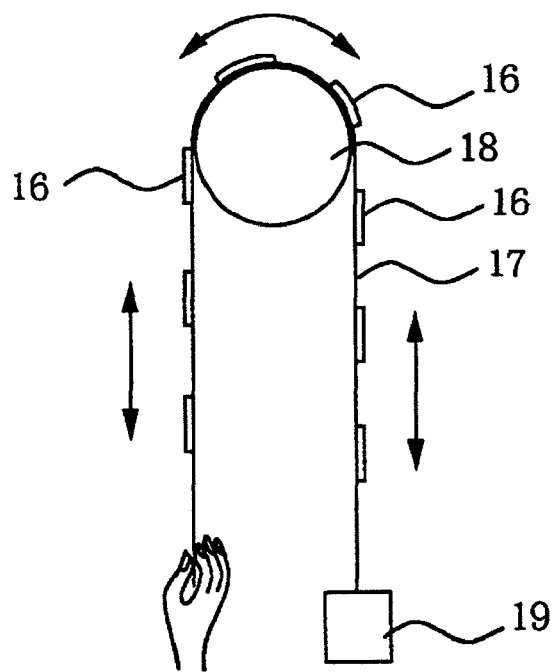
FIG. 11 shows a side view for explaining the bending test.

And then, as indicated in FIG. 10 (*a*), 20 pieces IC tags are attached with a pressure-sensitive adhesive on a polyethylene terephthalate film 17 having a width of 75 mm and a thickness of 25 μm in a state that IC tags are lined intermittently in the condition that each IC tag is placed in long side direction of the IC tag to form a long sheet used for a bending test. As indicated in FIG. 11, the long sheet used for a bending test was wound on the surface of the cylindrical roll 18 having a diameter of 20 mm, and the dead weight 19 having a load of 7.5 N was hung to one end of the long sheet used for a bending test. The bending test was conducted by grasping the other end of the long sheet used for a bending test with a hand and then repeating a pull up operation and a pull down operation, the long sheet used for a bending test was moved back and forth in 1000 times in a state that the long sheet used for a bending test was contacted on the surface of the cylindrical roll. According to the same method, as indicated in FIG. 10 (*b*), the bending test was carried out by using the long sheet used for a test in which IC tags are attached in a state that IC tags are lined intermittently in the condition that each IC tag is placed in short side direction of the IC tag.

The operation of the IC tag after the bending test was confirmed by conducting a reading and writing test (test machine produced by FEIG ELECTRONIC GmbH, trade name "ID ISC. MR101-USB"). All 40 pieces of the produced IC tags after the bending test operated normally.

Example 2

The IC tag was prepared in the same method as described in Example 1 except that with respect to the terminal portion 2, the length in the long side direction of the plane width gradually-increasing portion was 3.5 mm, and the maximum plane width of the plane width gradually-increasing portion was 3.5 mm, and one side edge of the plane width gradually-increasing portion was a concave curved line figure (curvature: a figure of the circular arc having 3.5 mm in radius R), and with respect to the terminal portion 3, the length in the short side direction of the plane width gradually-increasing portion was 3.3 mm, and the maximum plane width of the plane width gradually-increasing portion was 2.7 mm, and one side edge of the plane width gradually-increasing portion was a concave curved line figure (curvature: a figure of the circular arc having 3.5 mm in radius R). Thus, 40 pieces of the IC tag were produced.

The operation of the IC tag was confirmed by conducting a reading and writing test (test machine produced by FEIG ELECTRONIC GmbH, trade name "ID ISC. MR101-USB"). All 40 pieces of the produced IC tags operated normally.

Next, the bending test was performed in the same method as described in Example 1.

The operation of the IC tag after the bending test was confirmed by conducting a reading and writing test (test machine produced by FEIG ELECTRONIC GmbH, trade name "ID ISC. MR101-USB"). All 40 pieces of the produced IC tags after the bending test operated normally.

Comparative Example 1

Figure 2:
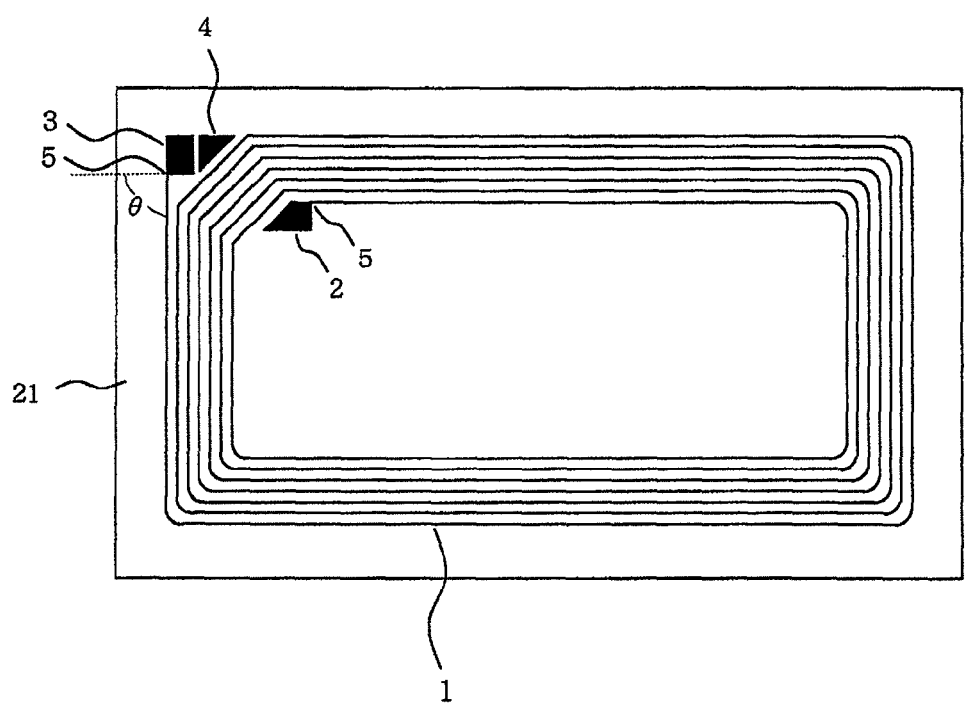
FIG. 2 shows a plane view of an electronic circuit of one embodiment of the prior arts.

The IC tag was prepared in the same method as described in Example 1 except that the circuit line and the terminal portion were formed in the figure as indicated in FIG. 2. Thus, 40 pieces of the IC tag were produced. In FIG. 2, the angle included between the straight line of the side edge of the terminal portion 2 and the tangent line at the junction 5 was 90 degree, and the angle included between the straight line of the side edge of the terminal portion 3 and the tangent line at the junction 5 was 90 degree.

The operation of the produced IC tag was confirmed by conducting a reading and writing test (test machine produced by FEIG ELECTRONIC GmbH, trade name "ID ISC. MR101-USB").

All 40 pieces of the produced IC tags operated normally.

Next, the bending test was performed in the same method as described in Example 1.

The operation of the IC tag after the bending test was confirmed by conducting a reading and writing test (test machine produced by FEIG ELECTRONIC GmbH, trade name "ID ISC. MR101-USB"). Among the 40 pieces of the IC tags after the bending test, the 33 pieces of the IC tags after the bending test were not operated normally and were judged as "not good".

By means of an optical microscope, the condition of the electronic circuit was observed. At the result, the breaking of the circuit was confirmed in the portion of the junction between the circuit line and the terminal portion. The condition was observed in all IC tags which were judged as "not good".

TABLE 1

|  | plane width gradually-increasing portion | curvature in radius R of plane width gradually-increasing portion | fraction defective after bending test % |
|---|---|---|---|
| Example 1 | existence | 2.5 mm | 0 (0/40) |
| Example 2 | existence | 3.5 mm | 0 (0/40) |
| Comparative Example 1 | Not existence | — | 82.5 (33/40) |

In Table 1, numeric values in parentheses in the column of fraction defective after bending test mean (defective number/sample number).

The invention claimed is:

1. An electronic circuit which comprises a circuit line and a terminal portion connected to the circuit line, wherein the terminal portion has a folding endurance structure at a junction where the terminal portion is connected to the circuit line, wherein the folding endurance structure of the terminal portion has a plane width gradually-increasing portion, in which the width of the terminal portion in plane view increases continuously or intermittently as the folding endurance structure of the terminal portion becomes away from the junction where the terminal portion is connected to the circuit line.

2. The electronic circuit as claimed in claim 1, wherein at least one side edge of the plane width gradually-increasing portion connected to the junction of the terminal portion is a curved line shape.

3. The electronic circuit as claimed in claim 2, wherein the terminal portion is selected from an IC chip mounting terminal portion, a jumper terminal portion or a through-hole terminal portion.

4. An IC inlet which comprises an IC chip connected to the electronic circuit as claimed in claim 3.

5. An IC tag which comprises a protecting layer laminated to cover the IC chip of the IC inlet as claimed in claim 4.

6. An IC inlet which comprises an IC chip connected to the electronic circuit as claimed in claim 2.

7. An IC tag which comprises a protecting layer laminated to cover the IC chip of the IC inlet as claimed in claim 6.

8. The electronic circuit as claimed in claim 1, wherein the terminal portion is selected from an IC chip mounting terminal portion, a jumper terminal portion or a through-hole terminal portion.

9. An IC inlet which comprises an IC chip connected to the electronic circuit as claimed in claim 8.

10. An IC tag which comprises a protecting layer laminated to cover the IC chip of the IC inlet as claimed in claim 9.

11. An IC inlet which comprises an IC chip connected to the electronic circuit as claimed in claim 1.

12. An IC tag which comprises a protecting layer laminated to cover the IC chip of the IC inlet as claimed in claim 11.

* * * * *